United States Patent
Bashkirov et al.

(10) Patent No.: US 12,017,359 B2
(45) Date of Patent: *Jun. 25, 2024

(54) METHOD FOR ROBOTIC TRAINING BASED ON RANDOMIZATION OF SURFACE DAMPING

(71) Applicant: Sony Interactive Entertainment Inc., Tokyo (JP)

(72) Inventors: Sergey Bashkirov, Salida, CA (US); Michael Taylor, San Mateo, CA (US)

(73) Assignee: SONY INTERACTIVE ENTERTAINMENT INC., Tokyo (JP)

(*) Notice: Subject to any disclaimer, the term of this patent is extended or adjusted under 35 U.S.C. 154(b) by 723 days.

This patent is subject to a terminal disclaimer.

(21) Appl. No.: 17/095,640

(22) Filed: Nov. 11, 2020

(65) Prior Publication Data
US 2022/0143822 A1    May 12, 2022

(51) Int. Cl.
*G06F 30/27*    (2020.01)
*B25J 9/12*     (2006.01)
(Continued)

(52) U.S. Cl.
CPC ........... *B25J 9/163* (2013.01); *B25J 9/12* (2013.01); *G06F 30/27* (2020.01); *G06N 3/084* (2013.01); *G06N 3/048* (2023.01)

(58) Field of Classification Search
CPC .. B25J 9/163; B25J 9/12; G06F 30/27; G06N 3/084; G06N 3/048; G06N 3/044; G06N 3/045; G06N 3/088
See application file for complete search history.

(56) References Cited

U.S. PATENT DOCUMENTS 5,719,480 A    2/1998  Bock et al.
9,786,202 B2 * 10/2017 Huang ................... G09B 23/28
(Continued)

FOREIGN PATENT DOCUMENTS

CA    3133873 A1    4/2020
CN    107610208 A   1/2018
(Continued)

OTHER PUBLICATIONS

Erlhagen et al, "The dynamic neural field approach to cognitive robotics" In J. Neural Eng. 3 (2006), R36-R54, [online] [retrieved on Jan. 5, 2022 (Jan. 5, 20220] Retrieved from the Internet.
(Continued)

*Primary Examiner* — Khoi H Tran
*Assistant Examiner* — Bryant Tang
(74) *Attorney, Agent, or Firm* — JDI PATENT; Joshua D. Isenberg; Robert Pullman

(57) ABSTRACT

A method, system and computer product for training a control input system involve taking an integral of an output value from a Motion Decision Neural Network for one or more movable joints to generate an integrated output value and generating a subsequent output value using a machine learning algorithm that includes a sensor value and a previous joint position if the integrated output value does not at least meet the threshold. Surface damping interactions with at least a simulated environment, a rigid body position and a position of the one or more movable joints based on an integral of the subsequent output value are simulated. The Motion Decision Neural Network is trained with the machine learning algorithm based upon at least a result of the simulation of the simulated environment and position of the one or more movable joints.

22 Claims, 11 Drawing Sheets

(51) Int. Cl.
  *B25J 9/16* (2006.01)
  *G06N 3/084* (2023.01)
  *G06N 3/048* (2023.01)

(56) References Cited

U.S. PATENT DOCUMENTS

| | | | |
|---|---|---|---|
| 10,937,240 | B2 | 3/2021 | Anderson |
| 11,278,433 | B2 * | 3/2022 | Herr ..................... B25J 19/0008 |
| 2003/0216895 | A1 | 11/2003 | Ghaboussi et al. |
| 2007/0255454 | A1 | 11/2007 | Dariush |
| 2008/0027582 | A1 | 1/2008 | Obinata et al. |
| 2011/0270443 | A1 | 11/2011 | Kamiya et al. |
| 2012/0166165 | A1 | 6/2012 | Nogami et al. |
| 2014/0107841 | A1 | 4/2014 | Danko |
| 2017/0334066 | A1 | 11/2017 | Levine et al. |
| 2018/0001206 | A1 | 1/2018 | Osman et al. |
| 2018/0250812 | A1 | 9/2018 | Narukawa |
| 2019/0324538 | A1 | 10/2019 | Rihn et al. |
| 2019/0384316 | A1 | 12/2019 | Qi et al. |
| 2020/0139539 | A1 | 5/2020 | Hasunuma et al. |
| 2020/0143229 | A1 | 5/2020 | Made et al. |
| 2020/0160535 | A1 | 5/2020 | Akbarian et al. |
| 2020/0218365 | A1 | 7/2020 | Todorov et al. |
| 2020/0290203 | A1 | 9/2020 | Taylor et al. |
| 2020/0293881 | A1 | 9/2020 | Taylor |
| 2020/0319721 | A1 | 10/2020 | Erivantcev et al. |

FOREIGN PATENT DOCUMENTS

| | | |
|---|---|---|
| CN | 110007750 A | 7/2019 |
| CN | 111653010 A | 9/2020 |
| TW | 201905729 A | 2/2019 |
| TW | 202026846 A | 7/2020 |
| WO | 2012079541 A1 | 6/2012 |
| WO | 2017129200 A1 | 8/2017 |
| WO | 2020008878 A1 | 1/2020 |

OTHER PUBLICATIONS

Hu et al., "Impedance with Finite-Time Control Scheme for Robot-Environment Interaction" in Mathematical Problems in Engineering, vol. 2020, Article ID 2796590, 18 p. May 25, 2020, [online] [retrieved on Jan. 5, 2022 (Jan. 1, 20220] Retrieved from the Internet.
International Search Report and Written Opinion for International Application No. PCT/US2021/58388), dated Feb. 4, 2022.
International Search Report and Written Opinion for International Application No. PCT/US2021/58390, dated Feb. 7, 2022.
International Search Report and Written Opinion for International Application No. PCT/US2021/58392, dated Feb. 7, 2022.
Peng et al., "Sim-to-Real Transfer of Robotic Control with Dynamics Randomization" in arXiv:1710.06537, 8 Pages, [Submitted on Oct. 18, 2017 (v1), last revised Mar. 3, 2018 (this version, v3)], [online] [retrieved on Apr. 13, 2022 (Apr. 13, 2022] Retrieved from the Internet.
Taiwanese Office Action for Country Code Application No. 893689, dated Jun. 28, 2022.
Arthur Juliani "Simple Reinforcement Learning with Tensorflow Part 8: Asynchronous Actor-Critic Agents (A3C)" Medium, Dated: Dec. 16, 2016, Available at: https://medium.com/emergent-future/simple-reinforcement-learning-with-tensorflow-part-8-asynchronous-actor-critic-agents-a3c-c88f72a5e9f2.
Arthur Juliani, "Simple reinforcement Learning with Tensorflow Part 0: Q-learning with Tables and Neural Networks" Medium, dated: Aug. 25, 2016. Available at: https://medium.com/emergent-future/simple-reinforcement-learning-with-tensorflow-part-0-q-learning-with-tables-and-neural-networks-d195264329d0.
Arthur Juliani, "Simple Reinforcement Learning with Tensorflow: Part 2—Policy-based Agents" Medium, Dated: Jun. 24, 2016. Available at: https://medium.com/@awjuliani/super-simple-reinforcement-learning-tutorial-part-2-ded33892c724.
Coulom, Remi "Apprentissage par renforcement utilsant des resaux de neurones, avec des applications au control moteur" PHD Thesis Institute Nat. Polytech. of Grenoble Jun. 19, 2002.
Ghoshavi, Abhijit "Neural Networks and Reinforcement Learning" Slide presentation Dept. of Eng. Mgmt. and Sys. Eng. Missouri Univ. of Sci. and Tech. Accessed Nov. 6, 2019.
Kniewasser, Gerhard et al. "Reinforcemetn Learning with Dynamic Movement Primitives—DMPs" Dept. of Theoretical Comp. Sci. Univ. of Tech., Graz (2013) Accessed Nov. 6, 2019.
Kober, Jens et al. "Reinforcement Learning to Adjust Robot Movements to New Situations" Proceedings of the Twenty-Second Int. Joint Conf. on Artificial Intelligence p. 2650-2655 Accessed Nov. 6, 2019.
Peng, Xue Bin, and Michiel van de Panne. "Learning Locomotion Skills Using DeepRL." Proceedings of the ACM SIGGRAPH / Eurographics Symposium on Computer Animation—SCA '17 (2017).
Sepp Hochreiter et al., "Long Short-Term Memory", Neural Computation, 9(8) 1735-1780, 1997, Cambridge, MA.
U.S. Appl. No. 16/693,093 to Michael Taylor and Sergey Bashkirov filed Nov. 22, 2019.
Zaiqiang Wu, et al. "Analytical Derivatives for Differentiable Renderer: 3D Pose estimation by Silhouette Consistency" Zhejiang University, ArXiv:1906.07870v1, Jun. 19, 2019 available at: https://arxiv.org/pdf/1906.07870v1.pdf.
Non-Final Office Action for U.S. Appl. No. 16/693,093, dated Sep. 27, 2023.
Non-Final Office Action for U.S. Appl. No. 17/095,617, dated Oct. 26, 2023.
Final Office Action for U.S. Appl. No. 17/095,617, dated Apr. 19, 2024.
Kiemel, J. C. et al. "Learning Robot Trajectories Subject to Kinematic Joint Constraints," Nov. 1, 2020. arXiv preprint arXiv:2011.00563. (Year:2020).
Kiemel, J.C. et al. True Aedept: Learning Smooth Online Trajectory Adaptation with Bounded Jerk, Acceleration and Velocity in Joint Space. Oct. 2020. In 2020 IEEE/RSJ International Conference on Intelligent Robots and Systems (IROS) (pp. 5387-5394). IEEE. (YEar:2020).
Non-Final Office Action for U.S. Appl. No. 17/095,586, dated May 6, 2024.

\* cited by examiner

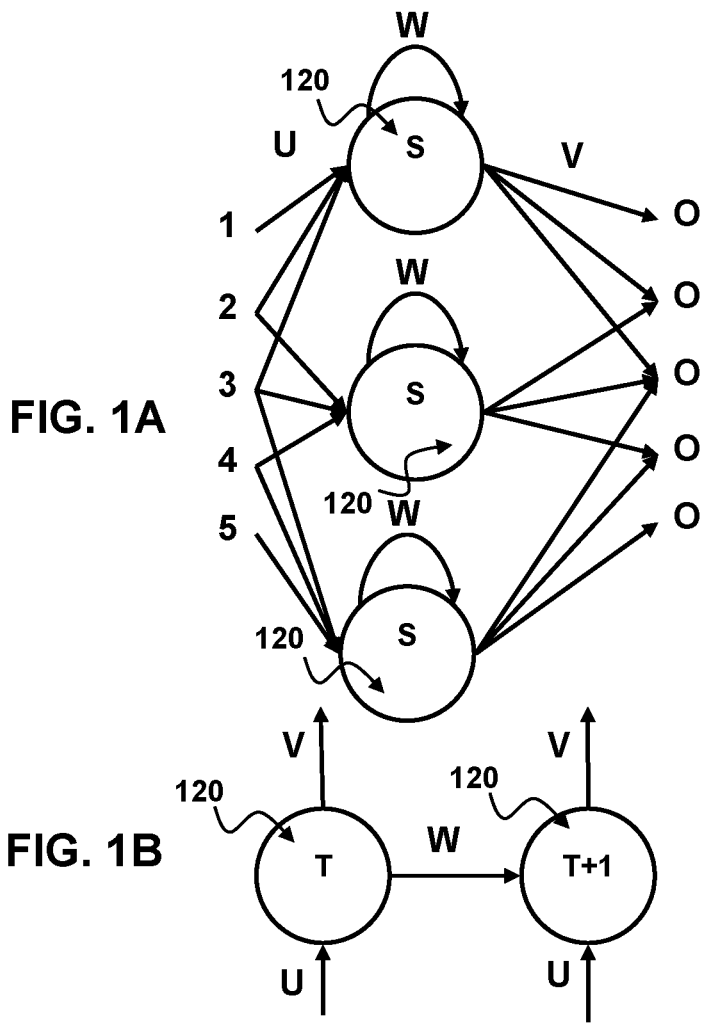
FIG. 1A
FIG. 1B
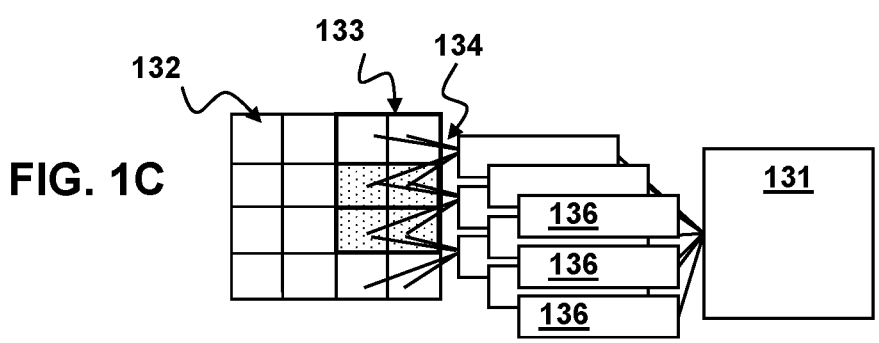
FIG. 1C

METHOD FOR ROBOTIC TRAINING BASED ON RANDOMIZATION OF SURFACE DAMPING

FIELD OF THE DISCLOSURE

Aspects of the present disclosure relate to motion control using machine learning specifically aspects of the present disclosure relate to the training of Neural Networks in physics based animation and motion control systems.

BACKGROUND OF THE DISCLOSURE

A common technique for models is to create a virtual skeleton for the model with flexible or movable joints and rigid bones. A virtual skin is overlaid on top the virtual skeleton similar to how human muscle, fat, organs, and skin is integrated over bones. Human artists then painstakingly hand animate movement sets for the object using the virtual skeleton as a guide for the range of motion. This is a time consuming process and also requires an artistic touch as there is a narrow window between life like movements and movements that fall into the uncanny valley. Some production studios avoid the difficult and time-consuming process of life-like animation by employing motion capture of human models. This technique is expensive and can be time consuming if a large number of motions are required or if there are many different characters that need to be modeled.

Robots may be modeled virtually with bones for rigid sections and joints for movable sections. This type of model control makes it easier for robot animators to create life-like movements for the robot. Movement of the joints in the virtual skeleton may be translated to movement of the motors controlling the joints in the robot. The virtual model applies constraints to the joints to simulate the real world limitations of the joints of the robot. Thus, a virtual model of the robot may be used to control the physical robot. This sort of control is useful for animatronics.

A major problem with animation is the need for human controlled movement creation. Hand animation of characters is time consuming and infeasible for situations where many characters are needed with different movement characteristics, such as a scene of a mall in space where there are many different alien characters that have vastly different anatomies. One technique that has been used to lighten the load of animators in these situations is to generate one or two different movement models and then apply those movement models randomly to moving characters in the scene. This technique works well with many different models and a few different characters but on large scale, it creates a noticeable unnatural effect where many characters obviously are identical.

Machine learning represents an area that could be employed in character animation to reduce the need for human animators. Currently movement produced by neural networks trained using machine learning techniques results in unnatural jittery movements and special efforts have to be taken and or constraints on the solution put in place to avoid the problem of jitter. Additionally, current machine learning animation techniques fail to account for several real-world constraints. The lack of real-world constraints in animation models created through machine learning means that they are unsuitable for use as virtual models for controlling physical robots, especially in condition sensitive areas such as walking and balancing mechanics.

It is within this context that aspects of the present disclosure arise.

BRIEF DESCRIPTION OF THE DRAWINGS

The teachings of the present disclosure can be readily understood by considering the following detailed description in conjunction with the accompanying drawings, in which:

FIG. 1A is a simplified node diagram of a neural network for use in motion control according to aspects of the present disclosure.

FIG. 1B is a simplified node diagram of an unfolded neural network for use in motion control according to aspects of the present disclosure.

FIG. 1C is a simplified diagram of a convolutional neural network for use in motion control according to aspects of the present disclosure.

DESCRIPTION OF THE SPECIFIC EMBODIMENTS

Figure 1D:
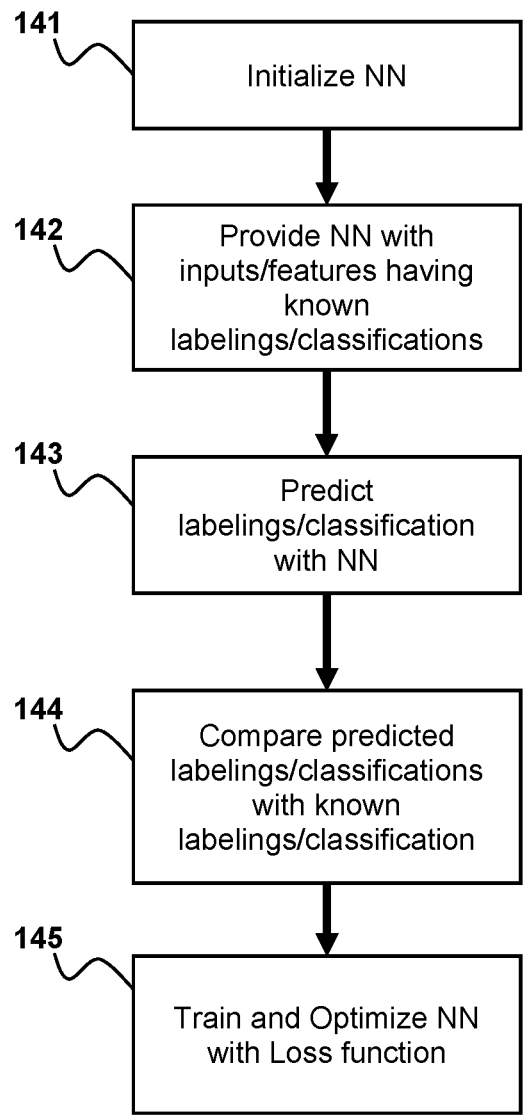
FIG. 1D is a block diagram of a method for training a neural network in development of motion control to aspects of the present disclosure.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Physics based animation requires a control scheme to generate joint actuator commands in such a way that it fulfills 3 goals at the same time: 1) approximately follow target animation; 2) preserve balance (don't fall down in case of walk, for example); 3) recover from external disturbances such as stumbling, external force, real/virtual model mismatch 4) account for real world constraints of physical robotic systems. According to aspects of the present disclosure, smooth life-like motions of a character may be obtained through training a NN to accept controlled mechanism/object sensor readings/observations as inputs and outputs either first or second derivative of mechanism servo control commands. The commands in the case of first derivative are passed through external time integration. Output of time integration are compared to a threshold to account for motor backlash, the time integrated commands that meets or exceeds the threshold are fed a) back to NN and b) to controlled mechanism the controlled mechanism values are simulated using a model that account for surface stiffness and surface stiffness. In the case of second derivative described above pattern is repeated twice. First and second integrations of the NN output are performed. The result of the second integration may be compared to a threshold to account for motor backlash, results that meet or exceed the threshold go a) back to the NN and b) to the controlled mechanism, the controlled mechanism values may be simulated using a model that account for surface stiffness and surface stiffness.

In accordance with the foregoing, a generalized method for training a control input system may proceed as follows by taking an integral of an output value from a Motion Decision Neural Network for one or more movable joints to generate an integrated output value. A subsequent output value is then generated using a machine learning algorithm that includes a sensor value and a previous joint position. In some implementations, the integrated output value may be compared to a backlash threshold and the subsequent output is generated if the integrated output value does not at least meet the threshold. Joint positions, rigid body positions, surface stiffness or surface damping interaction with a simulated environment may be simulated based on an integral of the subsequent output value. The Motion Decision Neural Network may then be trained with the machine learning algorithm based upon at least a result of the simulation.

General Neural Network Training

According to aspects of the present disclosure, the control input scheme may use machine learning with neural networks (NN). The NNs may include one or more of several different types of neural networks and may have many different layers. By way of example and not by way of limitation the neural network may consist of one or multiple convolutional neural networks (CNN), recurrent neural networks (RNN) and/or dynamic neural networks (DNN). The Motion Decision Neural Network may be trained using the general training method disclosed herein.

FIG. 1A depicts the basic form of an RNN having a layer of nodes 120, each of which is characterized by an activation function S, one input weight U, a recurrent hidden node transition weight W, and an output transition weight V. The activation function S may be any non-linear function known in the art and is not limited to the (hyperbolic tangent (tanh) function. For example, the activation function S may be a Sigmoid or ReLu function. Unlike other types of neural networks, RNNs have one set of activation functions and weights for the entire layer. As shown in FIG. 1B, the RNN may be considered as a series of nodes 120 having the same activation function moving through time T and T+1. Thus, the RNN maintains historical information by feeding the result from a previous time T to a current time T+1.

In some embodiments, a convolutional RNN may be used. Another type of RNN that may be used is a Long Short-Term Memory (LSTM) Neural Network which adds a memory block in a RNN node with input gate activation function, output gate activation function and forget gate activation function resulting in a gating memory that allows the network to retain some information for a longer period of time as described by Hochreiter & Schmidhuber "Long Short-term memory" Neural Computation 9(8):1735-1780 (1997), which is incorporated herein by reference.

FIG. 1C depicts an example layout of a convolution neural network such as a CRNN according to aspects of the present disclosure. In this depiction, the convolution neural network is generated for an input 132 with a size of 4 units in height and 4 units in width giving a total area of 16 units. The depicted convolutional neural network has a filter 133 size of 2 units in height and 2 units in width with a skip value of 1 and a channel 136 of size 9. For clarity in FIG. 1C only the connections 134 between the first column of channels and their filter windows is depicted. Aspects of the present disclosure, however, are not limited to such implementations. According to aspects of the present disclosure, the convolutional neural network that may have any number of additional neural network node layers 131 and may include such layer types as additional convolutional layers, fully connected layers, pooling layers, max pooling layers, local contrast normalization layers, etc. of any size.

As seen in FIG. 1D Training a neural network (NN) begins with initialization of the weights of the NN at 141. In general, the initial weights should be distributed randomly. For example, an NN with a tanh activation function should have random values distributed between $$-\frac{1}{\sqrt{n}} \text{ and } \frac{1}{\sqrt{n}}$$

where n is the number of inputs to the node.

After initialization the activation function and optimizer is defined. The NN is then provided with a feature vector or input dataset at 142. Each of the different feature vectors may be generated by the NN from inputs that have known labels. Similarly, the NN may be provided with feature vectors that correspond to inputs having known labeling or classification. The NN then predicts a label or classification for the feature or input at 143. The predicted label or class is compared to the known label or class (also known as ground truth) and a loss function measures the total error between the predictions and ground truth over all the training samples at 144. By way of example and not by way of limitation the loss function may be a cross entropy loss function, quadratic cost, triplet contrastive function, exponential cost, etc. Multiple different loss functions may be used depending on the purpose. By way of example and not by way of limitation, for training classifiers a cross entropy loss function may be used whereas for learning pre-trained embedding a triplet contrastive function may be employed. The NN is then optimized and trained, using the result of the loss function and using known methods of training for neural networks such as backpropagation with adaptive gradient descent etc., as indicated at 145. In each training epoch, the optimizer tries to choose the model parameters (i.e., weights) that minimize the training loss function (i.e. total error). Data is partitioned into training, validation, and test samples.

During training, the Optimizer minimizes the loss function on the training samples. After each training epoch, the model is evaluated on the validation sample by computing the validation loss and accuracy. If there is no significant change, training can be stopped and the resulting trained model may be used to predict the labels of the test data.

Thus, the neural network may be trained from inputs having known labels or classifications to identify and classify those inputs. Similarly, a NN may be trained using the described method to generate a feature vector from inputs having a known label or classification. While the above discussion is relation to RNNs and CRNNS the discussions may be applied to NNs that do not include Recurrent or hidden layers.

Reinforcement Learning

According to aspects of the present disclosure, the NN training may include reinforcement learning. Reinforcement Learning is an area of machine learning concerned with how software agents ought to take actions in an environment so as to maximize some notion of cumulative reward. It may be used without a neural network but in situations where there are many possible actions a NN layout may be employed to capture the elements in reinforcement learning.

The goal of reinforcement learning is to choose the optimal action based on a current state. A reward mechanic is used to train the reinforcement model to make the correct decision based on the state. It should be noted that, the reinforcement model is not limited to Neural Network and may include for example and without limitation values in a table or spreadsheet.

Figure 2A:
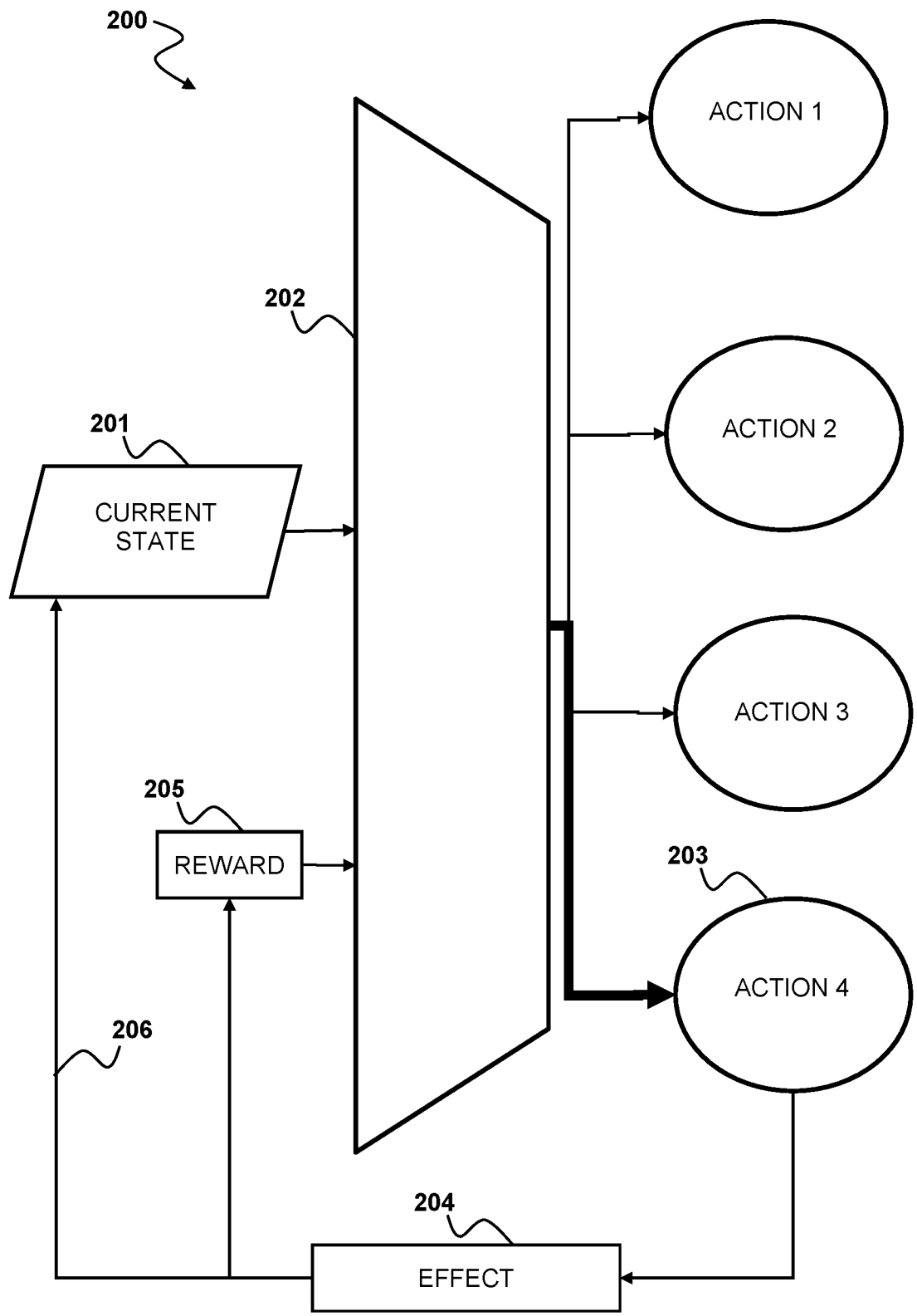
FIG. 2A is a block diagram showing Q reinforcement learning implemented with neural networks and machine learning algorithms according to aspects of the present disclosure.

FIG. 2A shows Q learning or discrete state reinforcement learning implemented with neural networks and machine learning algorithms 200. The reinforcement learning algorithm as discussed above seeks to determine an action 203 from a current 201. Once an action is chosen, the effect of the action is determined 204 and a reward function 205 is applied based on how closely the effect achieved an optimal action or chosen goal. A motion decision NN 202 may be employed to determine the action 203 from the current state 201. Additionally, the current state information 201 is updated at 206 with the effect 204 information and the NN can predict information based on the updated current state for a next action. In some embodiments, the NN 203 may be trained with a machine learning algorithm that uses Q-learning feedback as a value in the loss function for training the NN. For example and without limitation the loss function for the NN used reinforcement learning may be a sum of squares function. The sum of squares loss function with feedback is given by the equation here Q is the output of the NN:

$$\text{Loss} = \Sigma(\text{feedback} - Q)^2 \qquad \text{EQ. 1}$$

In reinforcement learning one example of feedback may be given by the Q-learning equation:

$$\text{feedback} = r(i, a, j) + \lambda \max_b Q(j, b) \qquad \text{EQ. 2}$$

Where the immediate reward is denoted by r(i, a, j,) where i is the current state, a is the action chosen at current state and j is the next state. The value of any state is given by the maximum value of Q value of actions in that state. Thus max Q(j,b) represents the expected reward from the best possible action taken at the following state. The quantity λ represents a future state discounting factor which serves to bias learning towards choosing immediate rewards. In some embodiments, λ=1/(1+R) where R is a discounting rate chosen to suit the particular task being learned. In the case of applications using Q-learning the controls must be made discrete for applications involving physical simulations or robots.

Thus, in reinforcement learning after an action is taken a feedback is calculated and a loss function is calculated using the feedback. The model is then updated using the loss function and backpropagation with adaptive gradient descent. This is best for a system that has discrete positions for actions. Many robotic and animation systems do not include discrete controls thus a Proximal Policy Optimization training algorithm may be used to implement continuous stochastic controls for the system.

Figure 2B:
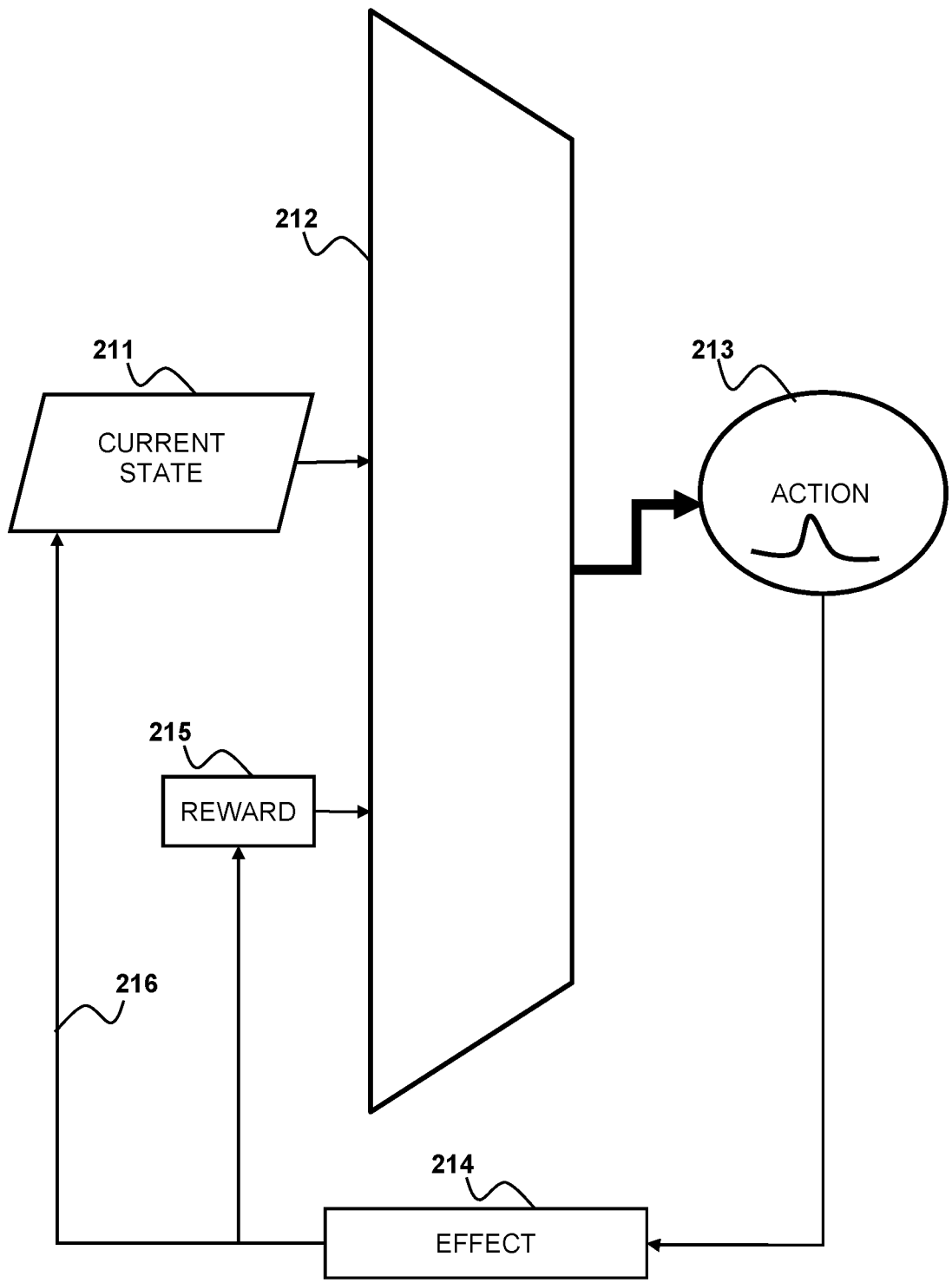
FIG. 2B is a block diagram showing Proximal Policy reinforcement learning implemented with neural networks and machine learning algorithms according to aspects of the present disclosure.

In other embodiments, a Proximal Policy Optimization training algorithm may be used. As shown in FIG. 2B the proximal Policy Optimization has an action 213 output space that is a continuous probability distribution as depicted by the bell curve in the action. Such an algorithm uses two networks: a Policy network (also called an Actor) to determine an action to take and an Advantage network (also called a Critic) to determine how good each action is, given the current state. Some implementations of the motion decision NNs 212 may include a policy subnetwork configured to provide a probability distributions for the action 213 that is optimal for achieving the desired effect 214 given the current state 211 and an advantage subnetwork for determining how good each action is given the current state 211. In other words, the policy $\pi(s,a)=p(a|s)$ represents the conditional probability density function of selection action $a \in A$ in state $s \in S$ at each control step t; the network receives a state st and samples an action $a_t$ from π. The simulated environment provides 214 a new state $s_t'=s_{t+1}$ 216 and generating a reward $r_t$ 215 sampled from its dynamics p(s'|s,a). The reward function is defined by the result of the transition between st to $s_{t+1}$ by taking a corresponding action at: $r_t=R(s_t,a_t,s_{t+1})$. For a parameterized policy, $\pi_\theta(s,a)$ the goal of the agent is to learn the parameters θ, which maximize cumulative reward given by the equation:

$$J(\pi_\theta) = E[\Sigma_{y=0}^T \gamma^t r_t | \pi_\theta] \qquad \text{EQ. 3}$$

Where $\gamma \in [0,1]$ a discounting factor and T is the training horizon. The gradient of the expected reward $\nabla_\theta J(\pi_\theta)$ can be determined using a policy gradient theory, which adjusts policy parameter θ to provide a direction of improvement according to the equation:

$$\nabla_\theta J(\pi_\theta) = \int_s d_\theta(s) \int_A \nabla_\theta \log(\pi_\theta(s,a)) \mathbb{A}(s,a) da\, ds \qquad \text{EQ. 4}$$

$d_\theta(s) = \int_s \Sigma_{t=0}^T \gamma^t p_0(s_0)(p(s_0 \to s|t, \pi_\theta) ds_0$ is a discounted state distribution, $p_0$ is an initial state distribution and $p(s_0 \to s|t, \pi_\theta)$ models the likelihood of reaching state s by starting at so and following the policy $\pi_\theta(s,a)$ for T steps. $\mathbb{A}(s,a)$ represents a general advantage function. There are many advantage functions for policy gradient based reinforcement learning and any suitable advantage function may be used with this function according to aspects of the present disclosure. One advantage function that may be used is a one-step temporal advantage function given by the equation:

$$\mathbb{A}(s_t, a_t) = r_t + \gamma V(s_t') - V(s_t) \qquad \text{EQ. 5}$$

Where $V(s) = \mathbb{E}[\Sigma_{t=0}^T \gamma^t r_t | s_0=s, \pi_\theta]$ is a state-value function defined recursively through EQ. 6

$$V(s_t) = \mathbb{E}_{r_t, s_t'}[r_t + \gamma V(s_t') | s_t, \pi_\theta] \qquad \text{EQ. 6}$$

Parameterized value function Vϕ(s), with parameters ϕ are learned iteratively similar to Q-learning as described above. The bellman loss function is minimized in this case according to the form:

$$L(\phi) = \mathbb{E}_{s_t, r_t, s'_t}\left[\frac{1}{2}(y_t - V_\phi(s_t))^2\right], \quad y_t = r_t + \gamma V_\phi(s'_t) \quad \text{EQ. 7}$$

$\pi_\theta$ and $V_\phi$ are trained in tandem using an actor critic framework. The action network may be biased toward exploration using a Gaussian distribution with a parameterized mean $\mu_\theta$ and a fixed covariance matrix $\Sigma = \text{diag}\{\sigma_i^2\}$ where $\sigma_i$ is specified for each action parameter. Actions are sampled from the distribution by applying Gaussian noise to the mean action choice EQ. 8

$$a_t = \mu_\theta(s_t) + \mathcal{N}(0, \Sigma) \quad \text{EQ. 8}$$

The Gradient for maximizing the action choice in EQ. 8 takes the form:

$$\nabla_\theta J(\mu_\theta) = \int_s d_\theta(s) \int_A \nabla_\theta \mu_\theta(s) \Sigma^{-1}(a - \mu_\theta(s)) A(s,a) da\, ds \quad \text{EQ. 9}$$

The result of optimization of the gradient EQ. 9 is to shift the mean of the action distribution towards actions that lead to higher expected rewards and away from lower expected rewards. For additional information see Peng et al. "Learning Locomotion Skills Using Deep RL: Does Choice of Action Space Matter?" SCA'17 Jul. 28, 2017.

Application to Movement

According to aspects of the present disclosure, the NN may be trained with a machine-learning algorithm to mimic realistic movement. The training set may be for example and without limitation, a time sequence of positions in space, directions, and/or orientations of a preselected subset of controlled object body parts. It is up to the machine learning algorithm to prepare a NN which is capable of changing joint angles in such a way that the controlled object exhibits a desired behavior and preserves balance at the same time. By way of example and not by way of limitation, time sequence of positions in space, directions, and/or orientations may be generated by motion capture of real movement, hand animation using motion capture dolls, hand animation using a virtual models, or any other method of capturing a set of realistic movements. In some embodiments, the training may use a reward function that uses misalignment errors of various raw and/or integral parameters which evolve the reward function towards a desired movement.

The State 201 or 211 may be a feature transformation $\Phi(q,v,\varepsilon)$ where c is an integral input taken from the integral of velocity with respect to time $\varepsilon = \int v\, dt$ generated as an output of the NN. According to some alternative aspects of the present disclosure, the feature transformation $\Phi(q,V,\varepsilon,i)$ may include the second integral of acceleration with respect to time $i = \iint A\, dt$. The transformation extracts a set of features from inputs to place them in a form compatible with the variable of the model being trained. In training it useful to include target reference motions $\Phi(\hat{q},\hat{v},\hat{\varepsilon})$ thus giving a combined state of $s_t = \Phi(q,v,\varepsilon)$, $\Phi(\hat{q},\hat{v},\hat{\varepsilon})$. Alternatively, the quaternion link locations for the state and reference motion may be used as discussed below.

The reward function may consist of a weighted sum of terms that encourage the policy to follow the reference motion:

$$r_{total} = r_{link}(-r_{collision}) + r_{ground}(-r_{limit}) \quad \text{EQ. 10}$$

Where w is a weight for the given term and r reference term.

Figure 6:
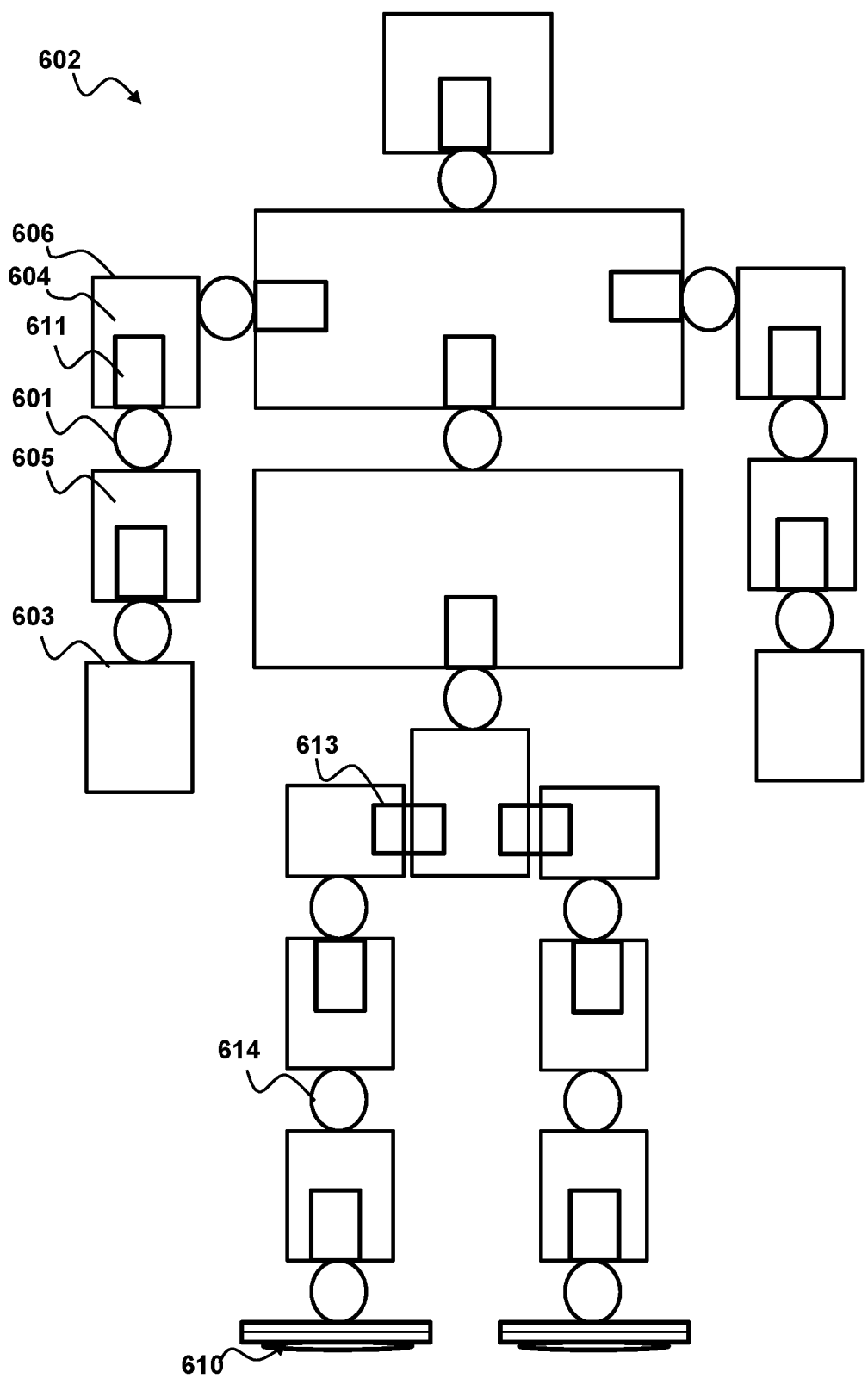
FIG. 6 is a diagram showing model character rig in a simulation for training according to aspects of the present disclosure.

As shown in FIG. 6 each joint 601 with rigid body 606 may be considered a link a series of links or a chain may form an agent or character rig model 602. The $L_2$ quaternion distance between a reference link location and an agent link location generated by the NN at time step t is subtracted from the $L_2$ quaternion distance between a reference link location and an agent link location generated by the NN at timestep t−1. This provides a differential error between the target link locations and the agent link locations that rewards the link for moving in the correct direction while penalizing it for moving in the wrong direction. The error between the agent pose and target pose is a weighted sum of the individual link orientations errors. The weights wink are chosen such that that the first link (including joint 601 and rigid body 606) in the chain is weighted higher than the last link 603 in the chain. As shown the first link in the chain includes both a joint and a rigid body while the last link only includes a rigid body. In many cases the last link in the chain may be as specialized tool such as, without limitation, a hand, grabber, foot, or other interaction device. This pushes the system to focus on aligning the root links before the end links during training. The same differential approach may be used for link velocities but only a small velocity coefficient $V_{coeff}$ of the velocity error with the distance error. The total differential reward is calculated as the sum of all individual link rewards.

$$r_{link} = \Sigma_{l \in links} W_{linkl} * (\text{dist}_{link}(t-1) - \text{dist}_{link}(t)) + v_{coeff} * (vel_{link}(t-1) - vel_{link}(t)) \quad \text{EQ. 11}$$

where $w_{link}$ is the individual link weight and $V_{coeff}$ is a small non-negative constant. The quantity $\text{dist}_{link}$ is the quaternion distance between link orientations which will now be described. In the case of application of real movement models taken from, for example and without limitation, motion capture or video may have a mismatch between the degrees of freedom in joints of the real movement model compared to the degrees of freedom of the joints of the agent 602. For example and without limitation a real human's joints may have three degrees of freedom whereas the agent's joints 601 may only have two degrees of freedom. Each link unit's axis is defined as a unit vector in the links local reference frame. For the quaternion distance metric, $q_a$ and $q_t$ represent the agent and link orientation quaternions respectively. The difference between orientations is thus provided by:

$$\Delta q = q_a^* * q_t \quad \text{EQ. 12}$$

Where the quaternion distance between links $d_{link}$ is provided by the equation:

$$d_{link} = 2 * \sin^{-1}(\Delta q_x^2 + \Delta q_y^2 + \Delta q_z^2) \quad \text{EQ. 13}$$

The angle between link axes is computed by the following. Let $\vec{e}_a$ and $\vec{e}_t$ the agent and target link axes converted to the world reference frame. The Axis distance is then computed by:

$$d_{axis} = \cos^{-1}(e_{a,x} * e_{t,x} + e_{a,y} * e_{t,y} + e_{a,z} * e_{t,z}) \quad \text{EQ. 14}$$

This introduced unit axis distance allows links to be mapped where there is an insufficient number of degrees of freedom.

Returning to the reward function of equation 10. The ($-c_{ollision}$) term is a penalty for self-collisions. As seen in FIG. 6 each link 604 may take up a volumetric space. The penalty may be applies whenever the volumetric space of link 604 comes into contact with the volumetric space of another link 605.

The term $r_{ground}$ may be applied based on foot ground interactions between the agent and the world. When processing training set data, an additional field is added to each link at each time step indicating if the link is on or off the ground. This information is used in the reward function to give a positive reward if the foot pressure sensor 610 is over a threshold and the foot is record as on the ground or alternatively if the pressure sensor is below a threshold and the foot is recorded to be off the ground.

$$r_P = \begin{cases} r_P & \text{if } gnd_{on} \text{ and } f_p > P_{th} \\ 0 & \text{if } gnd_{on} \text{ and } f_p < P_{th} \\ r_P & \text{if } gnd_{off} \text{ and } f_p < P_{th} \\ 0 & \text{if } gnd_{off} \text{ and } f_p > P_{th} \end{cases} \quad \text{EQ. 15}$$

Where $gnd_{on}$ and $gnd_{off}$ indicate the foot ground state, $f_p$ represents a foot pressure sensor 710 reading and Pth us a foot pressure threshold.

An additional positive may be given when the foot is on the ground. The reward is proportional to the angle between the foot local vertical axis and the world up vector.

$$\vec{e}_z = (0,0,1)^T$$

$$\overrightarrow{e_{z,world}} = Q_{foot} * \vec{e}_z * Q_{foot}^*$$

$$\alpha = \cos^{-1}(\overrightarrow{e_{z,world}}, [z])$$

$$r_{flat} = K_1 * (K_2 - \alpha) \quad \text{EQ. 16}$$

Where $\vec{e}_z$ indicates the vertical axis $Q_{foot}$ the foot orientation quaternion, $\overrightarrow{e_{z,world}}$ is the foot up vector in the world reference frame and $K_1$ and $K_2$ are constants. The complete ground reward is calculated as:

$$r_{ground} = r_p + r_{flat} \quad \text{EQ. 17}$$

The $(-r_{limit})$ term provides a penalty on a per joint basis if a target joint position is outside the physical limits of the joint this penalty pushes the training process to avoid entering areas where the control policy is unable to affect the agent state.

$$r_{limit} = \begin{cases} k_{joint} * (C_{joint} + (\alpha_i - \alpha_{i,lim}^{up})) & \alpha_i > \alpha_{i,lim}^{up} \\ k_{joint} * (C_{joint} + (\alpha_{i,lim}^{low} - \alpha_i)) & \alpha_i < \alpha_{i,lim}^{low} \end{cases} \quad \text{EQ. 18}$$

Where $C_{joint}$ and $k_{joint}$ are constants that define how sharply the penalty increases, $\alpha_i$ is the i-th joint position, $\alpha_{i,lim}^{up}$ is the i-th joint upper limit and $\alpha_{i,lim}^{low}$ is the i-th joint lower limit.

Iterations of the network may be trained updating algorithm to apply updates to the state as soon as possible based on sample rates of the inputs. For this purpose, input includes as many observations as possible. All available sensor readings are fed into NN. Some sensor readings are also preprocessed. For example, accelerometer and gyroscope readings are fed both as-is and fused into attitude and gravity direction in robot's ref frame. Preprocessed readings are also fed into NN.

Improved Motion Control with NNs

Figure 3:
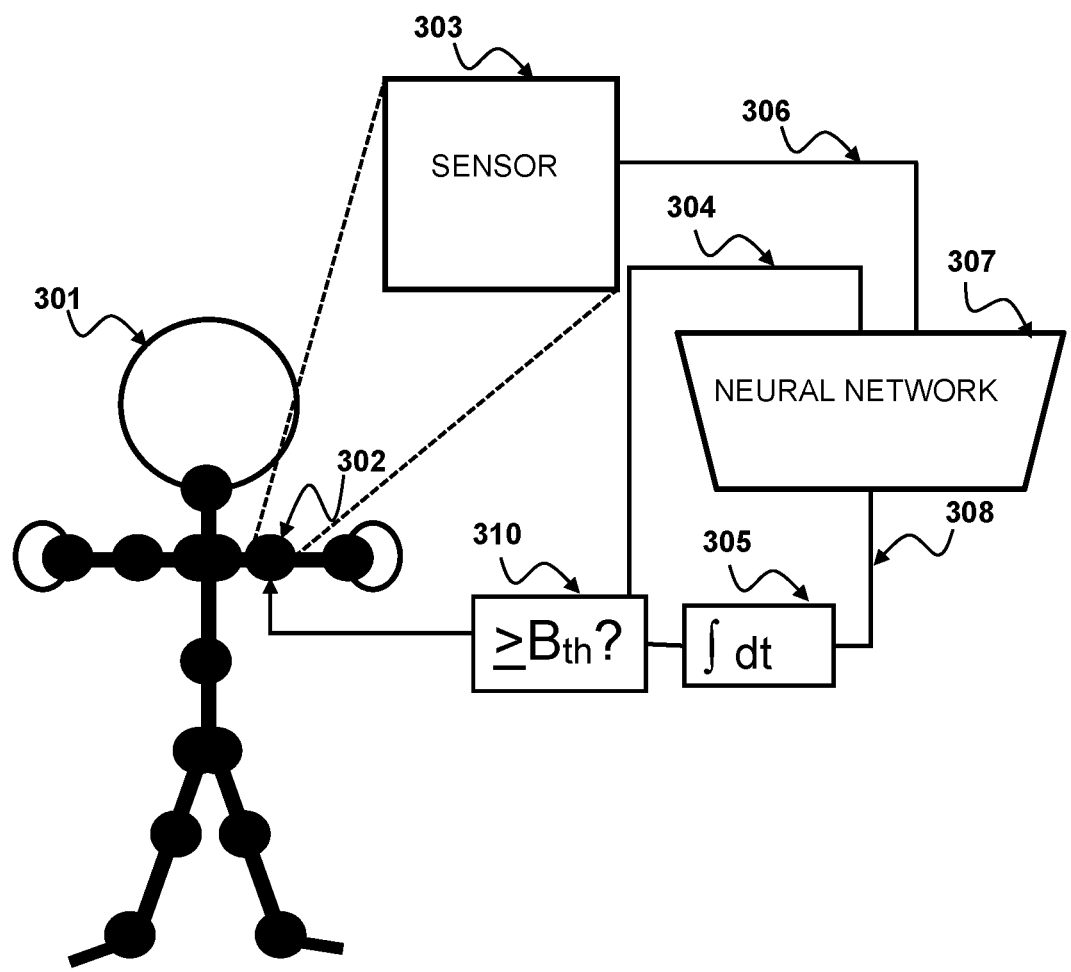
FIG. 3 is a diagram depicting motion control using sensor data and an integrated output that includes an integral and backlash threshold according to aspects of the present disclosure.
Figure 4:
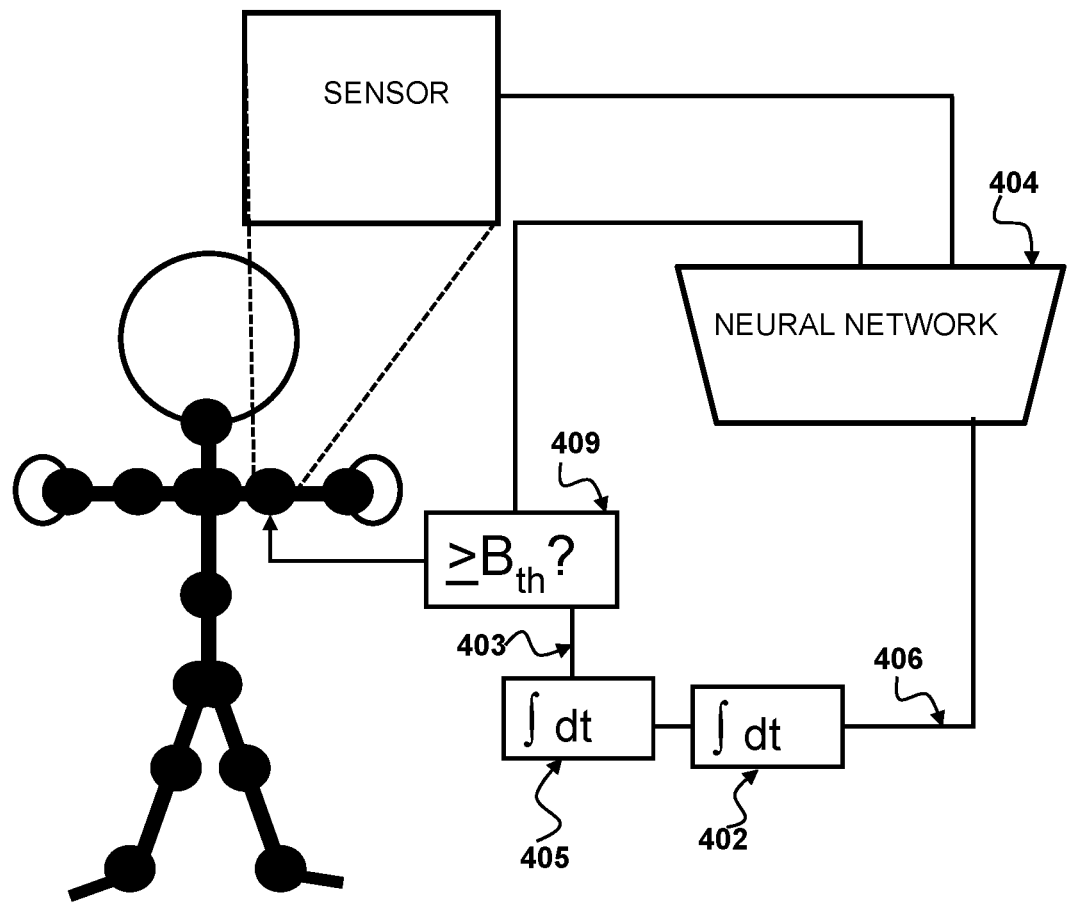
FIG. 4 is a diagram depicting motion control using sensor data and an integrated output that includes a second integral and a backlash threshold according to aspects of the present disclosure.

One major problem with NN control is choosing which information to provide to the NN as input, which is enough to restore dynamical state of the system at each moment in time. As depicted in FIG. 3 and FIG. 4, as a matter of feedback control output integral and output second integral in case of FIG. 4 are fed back into NN only after being compared and at least meeting a backlash threshold. As discussed above, prior trained NN for movement produced jittery, unrealistic movements. Thus according to aspects of the present disclosure smooth realistic movement by generating an integral of an output of the NN and using input information from a movable joint state input parameters in a NN.

FIG. 3 depicts training motion control according to aspects of the present disclosure. A character rig 301 within a simulation, which by way of example and not by way of limitation may be a character model, skeleton, robot or robotic apparatus that has at least once movable joint 302. As shown the character rig 302 has multiple movable joints as indicated by the black circles. The movable joint 302 may be a motor actuated hinge, ball joint, or any other connection between two rigid bodies that allows a defined range of controlled relative movement between the two rigid bodies. As discussed above in relation to FIG. 7 the rigid bodies 706 of the link may have volume of space 704 that they occupy and that may collide with the space occupied by any other rigid body or movable joint. The movable joint may be connected to a sensor 303, which is configured to generate information about the state of the movable joint, referred to herein as sensor values. This sensor 303 within the simulation may be configured to deliver information similar to information generated by sensors for physical robots which may include for example and without limitation, encoders, potentiometers, linear variable differential transformers, pressure sensors, gyroscopes, gravimeters, accelerometers, resolvers, velocity, or speed sensor. The sensor values for such sensors would correspond to the outputs of such sensors or information derived therefrom. Examples of sensor values from sensors on a robot include, but are not limited to a joint position, a joint velocity, a joint torque, a robot orientation, a robot linear velocity, a robot angular velocity, a foot contact point, a foot pressure, or two or more of these. For virtual characters, the sensor 303 may be virtual sensors and the sensor values may simply include data, e.g., position, velocity, acceleration data, related to the state of the movable joint. Examples of sensor values from a robot simulation include, but are not limited to a joint position, a joint velocity, a joint torque, a model orientation, a model linear velocity, a model angular velocity, a foot contact point, a foot pressure, or two or more of these. Position Data from the controller or virtual monitor may be passed 306 to the motion decision neural network 307 and used as state data during reinforcement learning.

As shown in FIG. 3, input information such as from the sensor 303 is passed directly 306 to the NN 307. The integrator 305 receives an output value 308 from the NN 307. During training the integrator 307 provides the integrated output the motor backlash threshold comparator 310. When not training, the NN 307 the integrator 307 provides the integrated output to the movable joint 302 and as integral output feedback to the NN 307.

The motor backlash comparator 310 used during training, compares the integrated output to a motor backlash threshold. When the integrated output meets or exceeds the motor backlash threshold the identical integrated output value is passed through to the movable joint 302 and as feedback 304 to the NN 307. If the integrated output 302 does not at least meet the motor backlash threshold the integrated output value is not passed back to NN 307 or the movable joint 302.

The motor backlash comparator 310 simulates real world constraints of physical motors. Physical motors require varying levels of force to move the limb position depending upon various factors for example and without limitation wear, temperature, motor design, gearing etc. The motor backlash comparator compensates for the backlash problem by training the NN 307 to over shoot the desired joint position and thus moving the joint in a way that accounts for motor backlash. The motor backlash threshold may be randomized during training. The motor backlash threshold may be randomized at the start of training or after each round of NN training.

Alternatively, the motor backlash threshold may be based on other factors in the simulation. For example and without limitation, these factors may include: time dependence of wear on the joint and motor may be modeled by having the motor backlash threshold increase with time. More granular wear models may also be applied to the backlash threshold that replicate the non-linearity of component wear. In a simple example the backlash threshold may be changed depending on the number of times the joint passes through or remains on a position.

Alternatively, the threshold may be changed based on the amount of time the joint spends at a position. Training the NN may require randomization of the backlash threshold to reduce NN overfitting. The motor backlash threshold may be randomized in non-linear ways to simulate non-linear wear on the joints and motor. For example a non-uniform growth equation such as;

$$B_{th} = Ae^{(-*x-\mu)^2/\sigma^2)}$$ EQ. 19

Where A, μ and σπ are randomized to simulate non-uniform joint and motor backlash. Alternatively A, μ and σ may be dependent upon a joint angle use or joint position use. The dependency of A, μ and σ may be probabilistic so that angles or positions that are used frequently have a higher chance of getting an increased motor backlash threshold. While EQ 19 describes one example on an equation for non-uniform in yet another example, a heat map may be generated to describe wear on different areas of the joint and on different surfaces. The heat map may describe areas with more use as hotter and areas with less use and cooler random noise may then be applied to reduce over-fitting. The heat map may be correlated with the backlash threshold so that areas of high use receive a higher threshold value than areas of low use and the threshold includes some random noise values to reduce over-fitting.

The motion decision NN 307 as discussed above, may be trained iteratively using machine learning algorithms that include reinforcement learning techniques such as policy learning. Q-leaning may be applied with discretized controls additionally any other machine learning technique suitable for the task may be used with control scheme provided according to aspects of the present disclosure. The motion decision NNs 307 may include additional subnetworks to generate embeddings or otherwise process state data. The motion decision NNs 307 may be configured to output one or more types of information to the movable joint or a motor/actuator controlling the movable joint.

The movable joint 302 may move based on the information output 308 by the motion decision NN 307 and this change may be detected by the sensor 303. During training, a simulation virtually replicates the movement of the movable joint 302 based on the information output 308 by the motion decision network with simulated physical constraints as discussed in the next section. From the simulation, the movement change in the movable joint is reported as a sensor output 303. Subsequently the new position and acceleration information may be used by the NN in a repetition of the process described above. This cycle may continue until a goal is achieved.

Here, an improvement to smooth movement imparted with the movable joint is achieved with the addition of integrated output 304 feedback calculated at the integrator 305 from the output 308 of the NN 307. One explanation for the smoothing effect created according to aspects of the present disclosure may be that the integral of the step function is a continuous function and the discontinuous controls output by the NN are converted to continuous actuator controls after going through the integrator.

As shown in FIG. 4, other integrated output feedback may be used as an input to the NN to create smoother movement. According to alternative aspects of the present disclosure, smooth movement may be created with a motion decision NN 404 using state information that includes a second integrated output 403 value generated from the second integrator 405. The second integrated output is provided to a motor backlash comparator 409 which, as discussed above, may pass the second integrated output value to the NN or ignore the second integrated output depending on whether the value meets or exceeds the motor backlash threshold ($B_{th}$). The second integrator 405 is configured to take the output of a first integrator 402. The first integrator 405 receives an output from the motion decision NN 404 and provides the first integral of that output.

Figure 5:
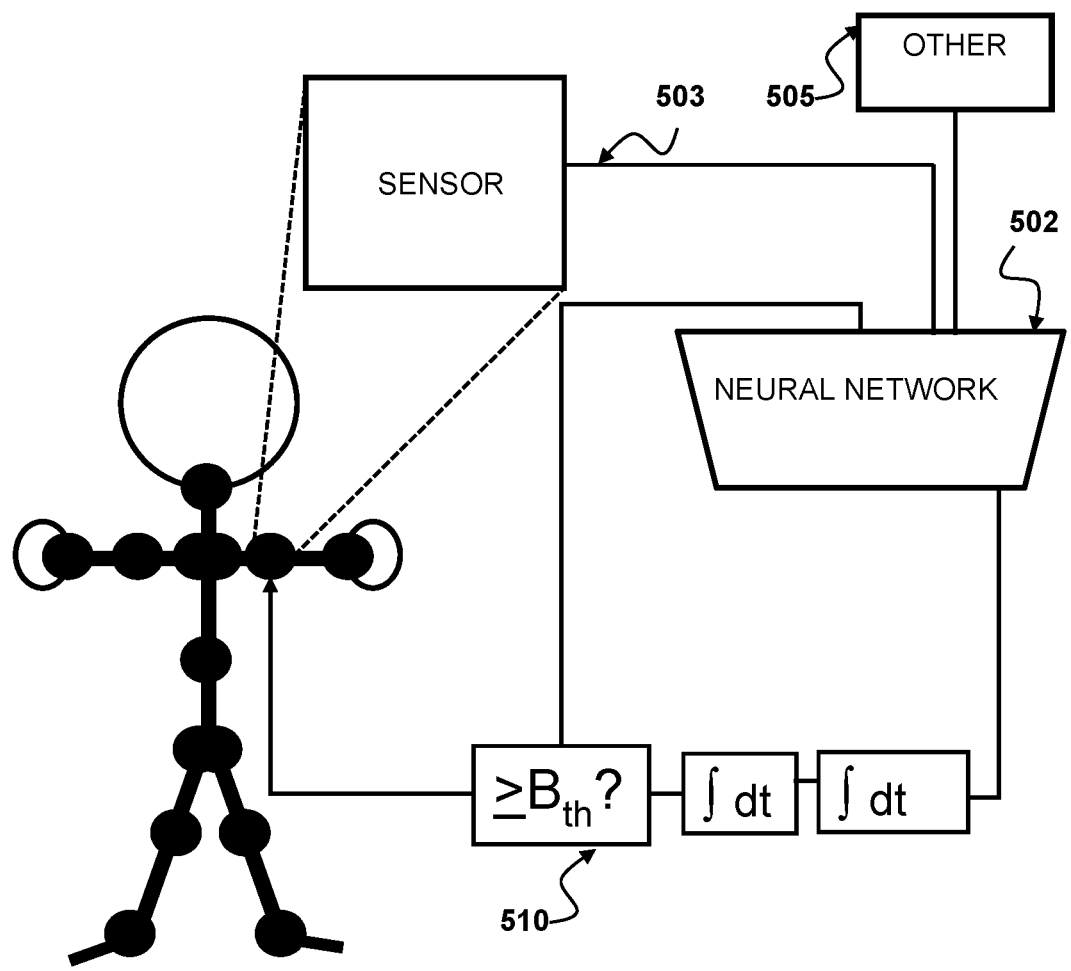
FIG. 5 is a diagram depicting motion control using sensor data, other data and an integrated output that includes a second integral and a backlash threshold for motion control according to aspects of the present disclosure.

FIG. 5 shows another alternative embodiment of the smooth motion, motion control using NNs according to aspects of the present disclosure. In this embodiment, the other information 505 is generated other sensors and passed 503 to the motion decision NNs 502. The other information may be without limitation, visual information, motion information or sound information that indicates the presence of a person or other important object. The addition of other information aids allows the motion decision NNs 502 to produce more situationally appropriate movements by providing more information to use in motion decision. The second integrator integrates the first integrated value and passes it to the motor backlash comparator 510. The second integrated output is compared to the motor backlash threshold and if it does not at least meet the threshold the value is discarded and is not passed to joint or the motion decision NN 502. If the first integrated output meets or exceeds the motor backlash threshold it is passed to the motion decision NN 502 and movable joint.

It should be noted that the controller or variable monitor according to aspects of the present disclosure may also detect torque from the movable joint and the torque information may also be provided to the NNs. The NNs may also be configured to produce torque information.

Control inputs obtained as discussed herein may be used for control of physical robots as well as for control of robot simulations, e.g., in video games, cloud video games, or game development engines, such as Unity3D from Unity Technologies of San Francisco, California, Lumberyard from Amazon Game Studios of Seattle, Washington, and Unreal Engine by Epic Games of Cary, North Carolina Simulation FIG. 6 as discussed above shows a model character rig in a simulator. The model may be thought of as links in a chain with rigid bodies 606 connected by movable joints 601. Here, the links in the chains are arranged to model a humanoid style robot 602. The model 601 also include joints that simulate multiple revolute joints of a robot, the joint here (for example joint 601) include rotation joint portion (represented by the smaller bold rectangle) and hinge portion (represented by the circle). The arrangement of the links allows the model to replicate human-like movement by having different types of joints in different areas of the model. As shown in the pelvis of the model there are rotation joints without hinge joints. A hip joint 613 of the model includes a hinge with a rotation joint. Similarly, a knee joint 614 of the model includes a hinge without a rotation joint. The end links of the chain, such as hand link 603 may include interaction devices; feet links may include sensor devices for balance such as pressure sensors 610. Within the simulation, each link is associated with dynamic properties. These dynamic properties include mass and inertia tensors. Links are considered to be interacting when the associated collision volumes 604, 605 intersect in space. Normal reaction and dry friction forces are applied to rigid bodies and a simulated environment.

Figure 7:
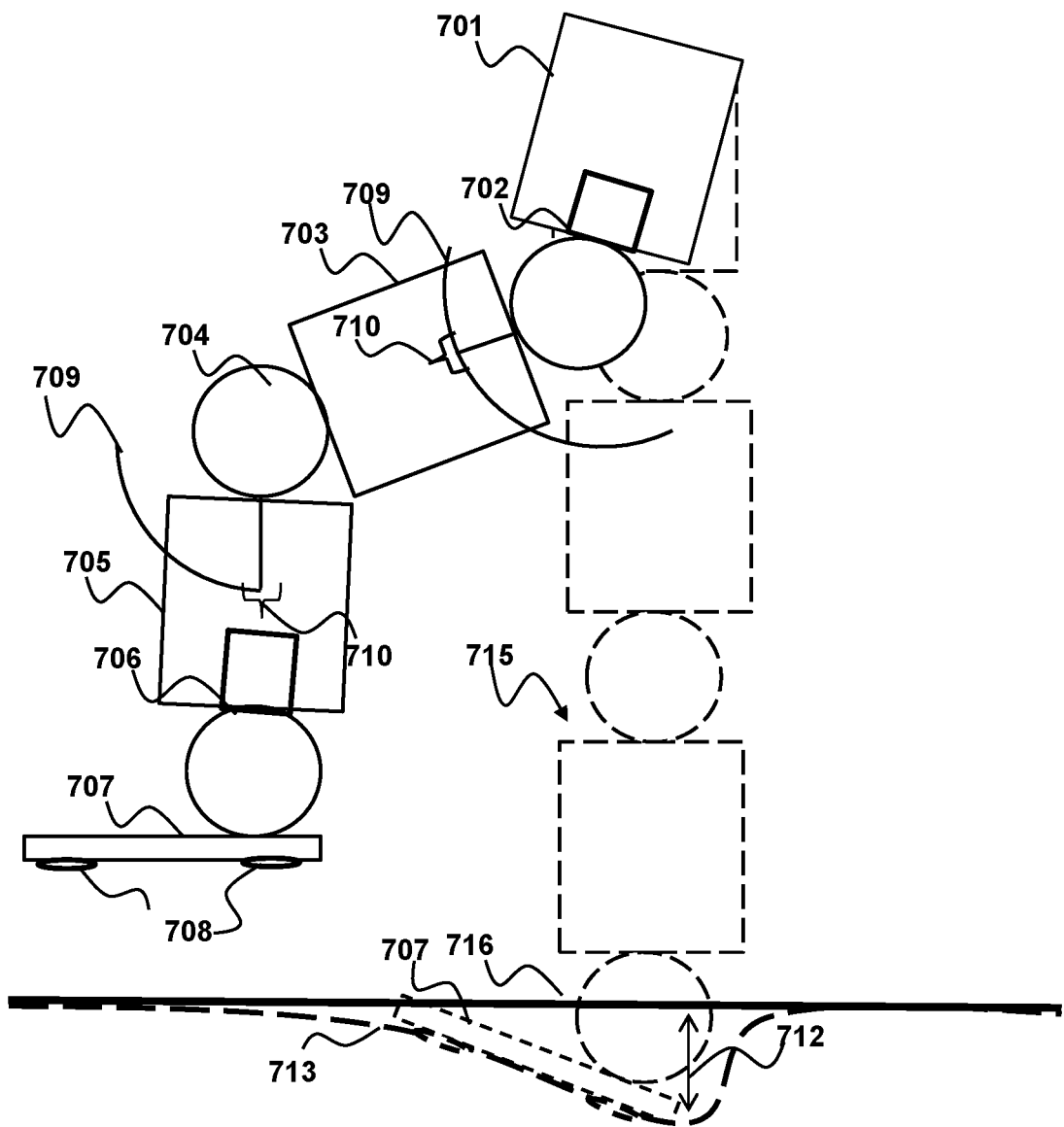
FIG. 7 is a diagram depicting the interactions and range of motions of leg portions of an example model according to aspects of the present the present disclosure.

FIG. 7 depicts the interactions and range of motions of the leg portions of one example of the model according to aspects of the present the present disclosure. The links of the simulator may be modeled with rigid bodies connected via one or more revolute joints. The joints have a finite range of motion limited by collision with other rigid bodies or the joint design. As shown each link may include one or more joints. For example and without limitation a pelvis link may include a pelvis rigid body 701 and a pelvis joint 702. A thigh link may include a thigh rigid body 703 and knee joint 704. A shin link may include a shin rigid body 705 and ankle joint 706 and a foot link may include a foot rigid body 707 and one or more foot pressure sensors 708. The one or more pressure sensors 708 may be used to describe the model's interaction with the simulated environment 816. Each joint may have a dead zone 710 which simulates backlash and which must be overcome before the rigid body may change position. Additionally, the joints have a range of motion 709 limited by the design of the join itself and collisions with other rigid bodies in the chain. The rigid bodies also interact with the simulated environment 716. The dotted lines represent a position of the leg 715 in which it is extended and interacting with the simulated environment 716. Here the original state of the simulated environment 716 is shown as a solid flat line and the deformation of the environment by interaction with the collision volume of the foot rigid body 710 is show by the dashed line 713. The mutual penetration depth of the collision volumes 712 and the dry friction forces defines the reaction force with rigid bodies and simulated environment. Note here that the simulated environment 711 is much more plastic than the foot rigid body 707 as such its depth of penetration 712 is much greater. Further, note that as result of the plastic deformation the simulated environment 713 the angle of the 711 is different than if it were on a non-deformed flat environment 716. The dry friction force is given by:

$$F = -\frac{v}{|v|} k F_{react} \qquad \text{EQ. 20}$$

Where F is the force of friction, v is the point relative velocity projection onto the surface and $F_{react}$ is the absolute value of force applied to the surface through the point.

The mutual penetration depth of the collision includes complex real-world constraints such as surface stiffness and surface damping. The stiffness of a surface may be measured by any number of different measurements including, Shore Durometer, Young's modulus, the Brinell scale, Rockwell hardness, Vickers hardness, or any other measurement which describes the elasticity of a material or force required to deform a material. The surface stiffness of the environment may be modeled in the simulation to replicate different surfaces a robot or other device may encounter during operation. An additional factor depth accounts for how deep into a material a limb or rigid body may penetrate.

A related, but different, constraint than surface stiffness is surface damping. Surface damping is related to the time dependence of surface deformation, whereas surface stiffness describes the force required to deform the material. Damping affects the time derivative of depth in other words damping affects how fast a limb or rigid body deforms a material when the two are in contact. Additionally, damping may be non-constant with time, meaning that sometimes a surface may deform slowly initially but then deformation quickly accelerates as more force is applied. For example, a surface such as clay may have a dry hardened outer crust that slowly deforms but once broken the surface deforms quickly as the underlying mud and dirt is easily displaced.

The mutual penetration depth of the collision for example and without limitation the collision of a robot foot on a clay surface may be partially modeled by:

$$F_{pen} = E*D + d_k*Ddt$$

Where $F_{pen}$ is the force of the mutual penetration depth of the collision, E is the surface stiffness, which may be provided by the stiffness of the material, D is the penetration depth, $d_k$ is the surface damping and Ddt is the time derivative of depth.

During training of the NN the variables of dry friction force, surface stiffness and/or surface damping may be randomized or otherwise modified. The use of randomized constraint values may train the NN to act on surfaces differently depending on the type of material for example, the NN may output different control values for soft surfaces were foot pose may change over time due to surface deformation under load compared to a hard non-pliable surface.

Figure 8:
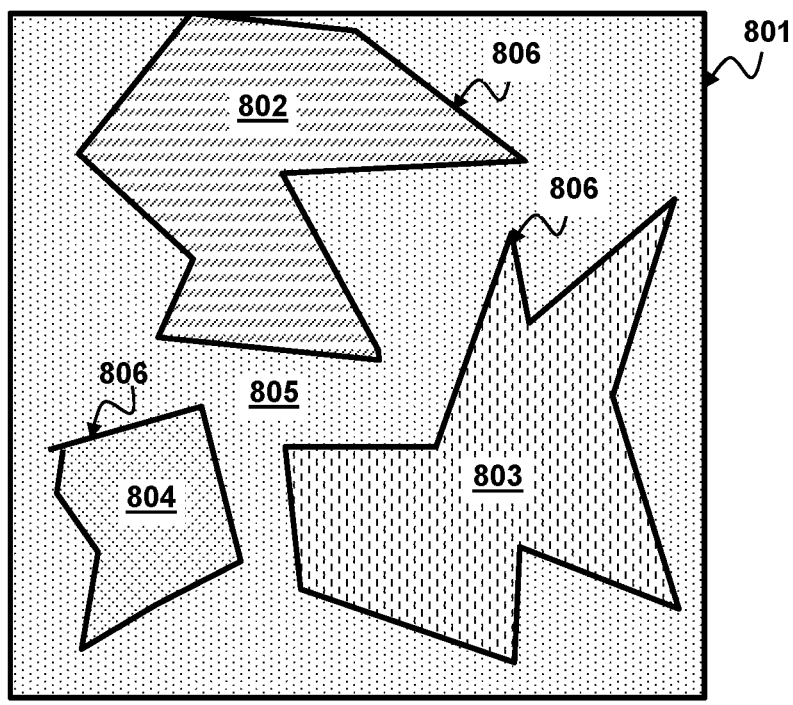
FIG. 8 depicts an example of a surface in a simulated environment according to aspects of the present disclosure.

FIG. 8 depicts an example of a surface 801 in a simulated environment according to aspects of the present disclosure. As shown, the surface 801 may include areas 802, 803, 804, with different, penetration depth, stiffness, dry friction force, and/or damping coefficients (hereinafter referred to as constraints) than other areas 805. As shown areas with different shading patterns represent areas having a different penetration depth, stiffness, dry friction and/or damping. There may be defined borders 806 between different areas having different constraints. The constraints may be constant within the borders 806 of each area but vary randomly between areas. The values of the constraints may be randomized using structured noise or simple Gaussian noise. For example and without limitation constraint values of each of the areas may be constant and the constraint values may be generated using Gaussian noise or uniformly distributed noise. In another example, the constraints value of each of the areas is not constant and is generated using coherent noise. In yet another example, the constraints value of a first subset of the areas is not constant and is generated using coherent noise and the constraint values of a second subset of the areas is generated using Gaussian noise or uniformly distributed noise.

The shapes of the different areas defined by their borders 806 may be randomized or, alternatively, the shapes of the areas may be generated to resemble real world objects such as rugs, carpet to hardwood transitions, tiles on tile floors, etc. The different areas having different constraints may be generated using Gaussian noise. Alternatively, the areas having different constraints may be generated using structured noise or coherent noise. Coherent noise may be for example and without limitation outlines having a recognizable outlines with noise added to randomize the borders of the recognizable outlines without losing the overall recognizable shape. Simplex or Perlin coherent noise may be used to pattern floor properties distribution while training the robot controller. The boundary shape may be governed by the initial coherent noise before applying a transformation. The overall shape of an area may be defined by the number of octaves, lacunarity and time persistence of the coherent noise frequency distribution of the coherent noise. Lacunarity refers to a measure of gaps in the coherent noise distribution, where a distribution having more or larger gaps generally has higher lacunarity. Beyond being an intuitive measure of gappiness, lacunarity can quantify additional features of patterns such as heterogeneity (i.e., the degree to which certain statistical properties of any part of the coherent noise distribution are the same as for any other part). Time Persistence, refers to a degree to which a prediction of a future value can be determined from extrapolation of a trend observed in past values.

In the simulation, the joints and rigid bodies may be associated with one or more sensor values, which replicate the position and type of sensors in a real robot. During training and simulation, the sensors provide information about the simulation to the NN. The virtual sensors may be for example and without limitation inertial measurement units (IMU), joint angle sensors, foot pressure sensors, clocks, etc. These different sensors may provide reading to the NN that may be used with movement training sets combined with simulated bias and noise during training.

System

Figure 9:
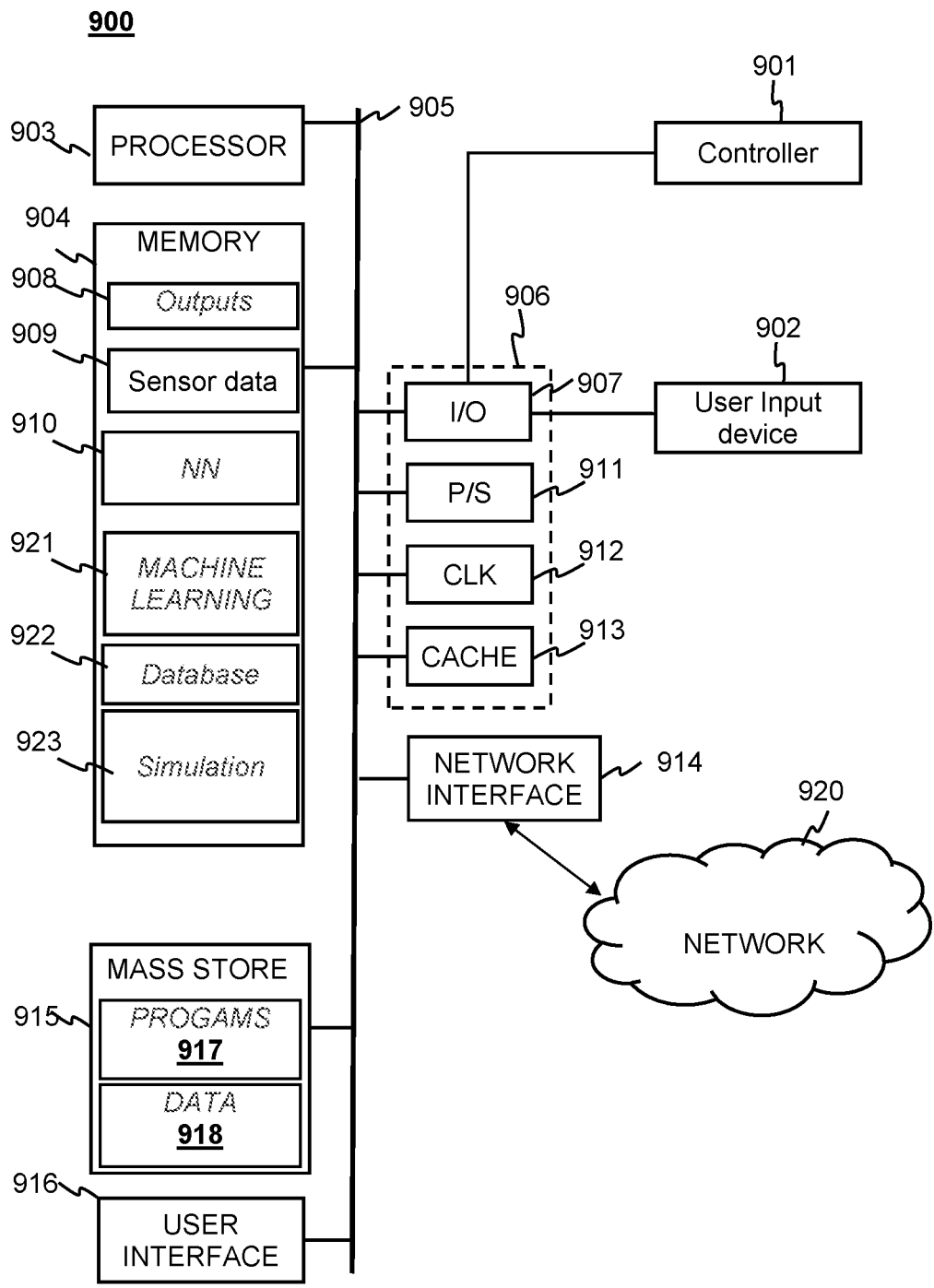
FIG. 9 is a system-level block diagram depicting a system implementing the training of neural networks and use of the motion control according to aspects of the present disclosure.

FIG. 9 depicts a system for physics based character animation using NNs with reinforcement learning like that shown in Figures throughout the application for example FIGS. 2, 3, 4 and 5. The system may include a computing device 900 coupled to a user input device 902. The user input device 902 may be a controller, touch screen, microphone, keyboard, mouse, joystick or other device that allows the user to input information including sound data in to the system. The user input device may be coupled to a haptic feedback device 921. The haptic feedback device 921 may be for example a vibration motor, force feedback system, ultrasonic feedback system, or air pressure feedback system. Additionally the system may include a controller 901 for a movable joint for example and without limitation, the controller may control a motor or actuator for a joint.

The computing device 900 may include one or more processor units 903, which may be configured according to well-known architectures, such as, e.g., single-core, dual-core, quad-core, multi-core, processor-coprocessor, cell processor, and the like. The computing device may also include one or more memory units 904 (e.g., random access memory (RAM), dynamic random access memory (DRAM), read-only memory (ROM), and the like).

The processor unit 903 may execute one or more programs, portions of which may be stored in the memory 904 and the processor 903 may be operatively coupled to the memory, e.g., by accessing the memory via a data bus 905. The programs may include machine learning algorithms 921 configured to adjust the weights and transition values of NNs 910 as discussed above. Additionally, the Memory 904 may store integrated outputs 908 that may be used, as input to the NNs 910 as state data additionally the integrated outputs may be stored database 922 for later training iterations. Sensor data 909 generated from the sensor may be stored in the Memory 904 and used as state data with the NNs 910 where the sensor data is either from a real sensor or a virtual model in a simulation. The memory 904 may also store a database 922. The database may contain other information such as information associated with creation and movement of the virtual character rig in a simulation. Such information may include, but is not limited to: motor backlash thresholds, friction coefficients, stiffness values, penetration depths, damping coefficients, reference movement information and movement simulations. Additionally, the database 922 may be used during generation of the error 908 to store integral values of Control data 909 according to FIG. 3, 4 or 5. Simulation data 923 including physical properties of materials of the virtual character rigs, simulated and environments and instructions for simulating interactions between virtual characters and environments may also be stored in memory 904. The database 922, sensor data 909 integrated outputs 908 and machine-learning algorithms 921 may be stored as data 918 or programs 917 in the Mass Store 918 or at a server coupled to the Network 920 accessed through the network interface 914.

Control data and the error, may be stored as data 918 in the Mass Store 915. The processor unit 903 is further configured to execute one or more programs 917 stored in the mass store 915 or in memory 904 which cause processor to carry out the one or more of the methods described above.

The computing device 900 may also include well-known support circuits, such as input/output (I/O) 907, circuits, power supplies (P/S) 911, a clock (CLK) 912, and cache 913, which may communicate with other components of the system, e.g., via the bus 905. The computing device may include a network interface 914. The processor unit 903 and network interface 914 may be configured to implement a local area network (LAN) or personal area network (PAN), via a suitable network protocol, e.g., Bluetooth, for a PAN. The computing device may optionally include a mass storage device 915 such as a disk drive, CD-ROM drive, tape drive, flash memory, or the like, and the mass storage device may store programs and/or data. The computing device may also include a user interface 916 to facilitate interaction between the system and a user. The user interface may include a monitor, Television screen, speakers, headphones or other devices that communicate information to the user.

The computing device 900 may include a network interface 914 to facilitate communication via an electronic communications network 920. The network interface 914 may be configured to implement wired or wireless communication over local area networks and wide area networks such as the Internet. The device 900 may send and receive data and/or requests for files via one or more message packets over the network 620. Message packets sent over the network 920 may temporarily be stored in a buffer in memory 904. The control data 909 and NNs 910 may be available through the network 920 and stored partially in memory 904 for use.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for training a control input system comprising:
   a) taking an integral of an output value from a Motion Decision Neural Network for one or more movable joints to generate an integrated output value;
   b) generating a subsequent output value using a machine learning algorithm that includes a sensor value and a previous joint position if the integrated output value does not at least meet the threshold;
   c) simulating surface damping interactions with at least a simulated environment, a rigid body position and a position of the one or more movable joints based on an integral of the subsequent output value; and
   d) training the Motion Decision Neural Network with the machine learning algorithm based upon at least a result of the simulation of the simulated environment and position of the one or more movable joints.

2. The method of claim 1 wherein simulating surface damping interactions includes simulating a time derivative penetration depth of the simulated environment.

3. The method of claim 2 wherein the penetration depth is randomized.

4. The method of claim 1 wherein a surface damping value of the simulated environment is randomized.

5. The method of claim 1 further comprising repeating steps a) through d).

6. The method of claim 5 wherein a surface damping value is randomized for each repetition.

7. The method of claim 1 wherein simulating surface damping interactions includes simulating dry friction forces.

8. The method of claim 1 wherein simulating surface damping interactions includes surface damping values of at least the simulated environment modeled as areas on a surface where each area has an associated surface damping value.

9. The method of claim 8 wherein the surface damping value of each area is randomly varied.

10. The method of claim 8 wherein the surface damping value of each of the areas is not constant and is generated using coherent noise.

11. The method of claim 8 wherein the surface damping value of each of the areas is constant and is generated using Gaussian noise or uniformly distributed noise.

12. The method of claim 8 wherein the surface damping value of a first subset of the areas is not constant and is generated using coherent noise and wherein the surface damping value of a second subset of the areas is constant and is generated using Gaussian noise or uniformly distributed noise.

13. The method of claim 8 wherein a shape of the areas is randomized.

14. The method of claim 8 wherein shapes of the areas are generated using coherent noise having at least one area shape based on a real object with noise added to the shape of the area.

15. The method of claim 8 wherein a shape of the areas is defined using coherent noise including the number of octaves, lacunarity, time persistence of the coherent noise or frequency distribution of the coherent noise.

16. The method of claim 1 wherein values of the surface damping of at least the simulated environment are modeled as a simplex or Perlin distribution of values on a surface.

17. A input control system comprising:
   a processor;
   a memory coupled to the processor;
   non-transitory instruction embedded in the memory that when executed by the processor cause the processor to carry out the method for training control input comprising:
   a) taking an integral of an output value from a Motion Decision Neural Network for one or more simulated movable joints to generate an integrated output value;
   b) generating a subsequent output value using a machine learning algorithm that includes a simulated sensor value and a previous joint position if the integrated output value does not at least meet the threshold;
   c) simulating surface damping interactions with at least a simulated environment, a rigid body position and a position of the one or more simulated movable joints based on an integral of the subsequent output value; and
   d) training the Motion Decision Neural Network with the machine learning algorithm based upon at least a result of the simulation of the simulated environment and position of the one or more movable joints.

18. The system of claim 17 wherein simulating surface damping interactions includes simulating a time derivative penetration depth of the simulated environment.

19. The system of claim 18 wherein the penetration depth is randomized.

20. The system of claim 17 wherein a surface damping value of the simulated environment is randomized.

21. The system of claim 17 further comprising repeating steps a) through d) wherein a surface damping value is randomized for each repetition.

22. A computer readable medium having non-transitory instruction embedded thereon that when executed cause a computer to carry out the method for training a control input system comprising:
   a) taking an integral of an output value from a Motion Decision Neural Network for one or more movable joints to generate an integrated output value;
   b) generating a subsequent output value using a machine learning algorithm that includes a sensor value and a previous joint position if the integrated output value does not at least meet the threshold;
   c) simulating surface damping interactions with at least a simulated environment, a rigid body position and a position of the one or more movable joints based on an integral of the subsequent output value; and
   d) training the Motion Decision Neural Network with the machine learning algorithm based upon at least a result of the simulation of the simulated environment and position of the one or more movable joints.

* * * * *